(12) United States Patent
Abdelli (10) Patent No.: US 7,355,466 B2
(45) Date of Patent: Apr. 8, 2008

(54) PASSIVE MIXER WITH DIRECT CURRENT BIAS

(75) Inventor: Said E. Abdelli, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/341,350

(22) Filed: Jan. 26, 2006

(65) Prior Publication Data

US 2007/0170973 A1 Jul. 26, 2007

(51) Int. Cl.
*G06F 7/16* (2006.01)

(52) U.S. Cl. .................. 327/356; 327/359; 455/326

(58) Field of Classification Search ............... 327/356, 327/359; 455/326
See application file for complete search history.

(56) References Cited

U.S. PATENT DOCUMENTS

| | | | | |
|---|---|---|---|---|
| 5,642,071 | A * | 6/1997 | Sevenhans et al. ......... | 327/359 |
| 5,859,558 | A * | 1/1999 | Chen et al. ................ | 327/355 |
| 5,859,559 | A * | 1/1999 | Hong et al. ................ | 327/359 |
| 6,040,731 | A * | 3/2000 | Chen et al. ................ | 327/359 |
| 6,121,819 | A * | 9/2000 | Traylor ....................... | 327/359 |
| 6,242,963 | B1 * | 6/2001 | Su et al. ..................... | 327/359 |
| 6,480,066 | B1 * | 11/2002 | Madni ........................ | 330/254 |
| 6,483,365 | B2 * | 11/2002 | Morishita .................... | 327/314 |
| 6,639,447 | B2 * | 10/2003 | Manku et al. ............... | 327/359 |
| 6,810,240 | B2 * | 10/2004 | Donig et al. ................ | 455/313 |
| 6,812,771 | B1 * | 11/2004 | Behel et al. ................ | 327/359 |
| 6,826,393 | B1 * | 11/2004 | Komurasaki et al. ....... | 455/326 |
| 6,871,057 | B2 * | 3/2005 | Ugajin et al. ............... | 455/323 |
| 7,120,414 | B2 * | 10/2006 | Kim et al. .................. | 455/313 |
| 7,161,406 | B1 * | 1/2007 | Ferris .......................... | 327/359 |

* cited by examiner

*Primary Examiner*—Kenneth B. Wells
(74) *Attorney, Agent, or Firm*—McDonnell Boehnen Hulbert & Berghoff LLP (57) ABSTRACT

Mixer circuits with direct-current bias are disclosed. An example embodiment of such a mixer includes a first differential transistor pair and a second differential transistor pair. The example mixer also includes first and second local oscillator signal terminals and first and second mixed signal terminals. The first and second local oscillator signal terminals are coupled with the first and second differential transistor pairs. The first mixed signal terminal is coupled with the first differential pair and the second mixed signal terminal is coupled with the second differential pair. The mixer further includes first and second baseband signal terminals, where each baseband signal terminal is coupled with the first differential pair and the second differential pair. The mixer still further includes a first current source and a second current source. The first current source is coupled with the first differential pair and the first mixed signal terminal, and provides a first direct-current bias to the first differential pair. The second current source is coupled with the second differential pair and the second mixed signal terminal, and provides a second direct-current bias to the second differential pair.

15 Claims, 7 Drawing Sheets

PASSIVE MIXER WITH DIRECT CURRENT BIAS

BACKGROUND

1. Field

This disclosure relates to mixer circuits.

2. Description of Related Art

Mixer circuits are commonly used in a number of applications. As one example, they are often used in radio frequency (RF) applications for up-converting (up-mixing) or down-converting (down-mixing). In this context, up-converting is the process of mixing a baseband signal (such as a differential baseband signal) with an RF signal (such as a differential RF signal) that is generated by a local oscillator (LO) circuit that operates in the RF range. Alternatively, an intermediate frequency (IF) may also be used in the mixing process. In such a situation, multiple mixing stages may be used to convert between baseband frequencies and RF frequencies. For purposes of this disclosure, the term "baseband" will be used to describe the source signal that is being mixed and/or unmixed with an RF signal. It will be appreciated, however, that in such applications an IF signal could be used in place of a baseband signal.

An up-mixing (up-conversion) process generates a mixed RF signal with the baseband signal information included with (mixed with) an RF signal generated by the LO. Down-converting is the process of separating (un-mixing) the baseband signal from the mixed RF signal. This is typically accomplished by using a mixer circuit with a local oscillator of substantially an identical frequency as was used to mix the mixed RF signal.

One typical type of mixer circuit that is used in such application is a passive mixer circuit, which may be implemented using a complementary-metal-oxide semiconductor circuit fabrication process (e.g. on an integrated circuit). However, such circuits have certain drawbacks. For instance, the LO signal used in such circuits must have an amplitude that is on the order of the operating voltage for the particular technology with which the mixer circuit is implemented. Designing and manufacturing such LO circuits that operate at a desired frequency (e.g., in the range of 1 to 5 GHz), have sufficient signal amplitude ("high amplitude LO circuits") and have adequate timing characteristics (e.g., switching times) is difficult and may be prohibitive for certain applications.

For instance, the high power consumption of such LO circuits may be incompatible with battery operated consumer devices due the reduction of battery life resulting from such power consumption. Further, the cost of manufacturing such LO circuits may also be prohibitive for use in certain products, such as commodity electronics (e.g., due to the integrated circuit area consumed by such circuits). Still further, design of such high amplitude LO circuits is difficult, time intensive and, therefore, expensive.

An additional drawback of such high amplitude LO circuits is that noise from the drivers included in the circuit may be communicated into other circuit stages with which the mixer circuit is coupled. For instance, in a situation where such a passive mixer is used in an RF receiver (e.g., in a down-mixing application), noise from the LO circuit drivers may be especially problematic, as such circuits tend to be susceptible to the effects of weak signals (e.g., noise). In such applications, noise from the LO drivers may adversely impact the performance of a mixer circuit that is being driven by the LO circuit drivers, as well the performance of circuits that are coupled with the mixer circuit.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are given by way of example and meant to be illustrative, not limiting in scope. In various embodiments, one or more of the above-described problems have been reduced or eliminated, while other embodiments are directed to other improvements.

Mixer circuits with direct current bias that overcome at least some of the foregoing issues are disclosed. One example of such a mixer circuit includes a first differential transistor pair and a second differential transistor pair. The first and second differential pairs may each include two n-type field effect transistors (FETs) with a common source connection. The mixer further includes first and second local oscillator signal terminals that are coupled with the first and second differential transistor pairs, such as via gate terminals of the transistors. The mixer circuit still further includes first and second mixed signal terminals. The first mixed signal terminal is coupled with the common source connection of the first differential pair and the second mixed signal terminal is coupled with the common source connection of the second differential pair. The mixer circuit also includes first and second baseband signal terminals (which may also act as intermediate frequency signal terminals). Each baseband signal terminal is coupled with a respective drain terminal of one of the two transistors of each of the first differential pair and the second differential pair.

In the example mixer circuit, a first direct-current bias is provided to the first differential transistor pair (via the common source connection) by a first current source that is coupled with the first differential pair and the first mixed signal terminal. Likewise, a second direct-current bias is provided to the second differential transistor pair (via the common source connection) by a second current source that is coupled with the second differential pair and the second mixed signal terminal. It will be appreciated that the first and second current sources may take any number of forms.

In one embodiment, the current sources may take the form of substantially matched current mirrors (e.g., two stacked n-type FETs) that are coupled with a bias-generation circuit, such as a cascoded voltage bias generation circuit. In such an approach, one or more voltage biases are generated by the bias-generation circuit. Those voltage biases are then used by the first and second current sources to mirror one or more reference currents that are supplied to the bias-generation circuit. There are, of course, numerous other approaches for providing such direct-current biases and any appropriate technique may be used to provide such current biases.

The example mixer circuit also includes a gate-bias circuit. The gate bias circuit is coupled with the first and second differential transistor pairs, and, in operation, provides a direct-current voltage bias to the gate terminals of the transistors of the first and second differential transistor pairs. Such a gate bias circuit may include a resistor divider that is coupled between a power supply terminal and an electrical ground terminal. The resistor divider, in such an approach, establishes the voltage potential that is to be applied to the gates of the transistors of the first and second differential pairs. The gate bias circuit may also include "series" resistors that deliver the gate-bias voltage potential to the transistors of the first and second differential pairs. Such series resistors provide electrical isolation between the gate terminals of differential pairs that being driven by the different components of the differential local oscillator signal (e.g., 180 degrees out of phase). This electrical isolation ensures that the signals are not "clamped" to each other.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

DETAILED DESCRIPTION

For purposes of this disclosure, the embodiments discussed herein are described in the context of radio frequency (RF) circuits. However, it will be appreciated that using such mixer circuits for RF applications is only one of any number of applications that are possible. For example, such circuits may be used as part of an analog to digital converter or as part of a limiter circuit, as two possibilities.

Differential Mixer Circuit Overview

Figure 1:
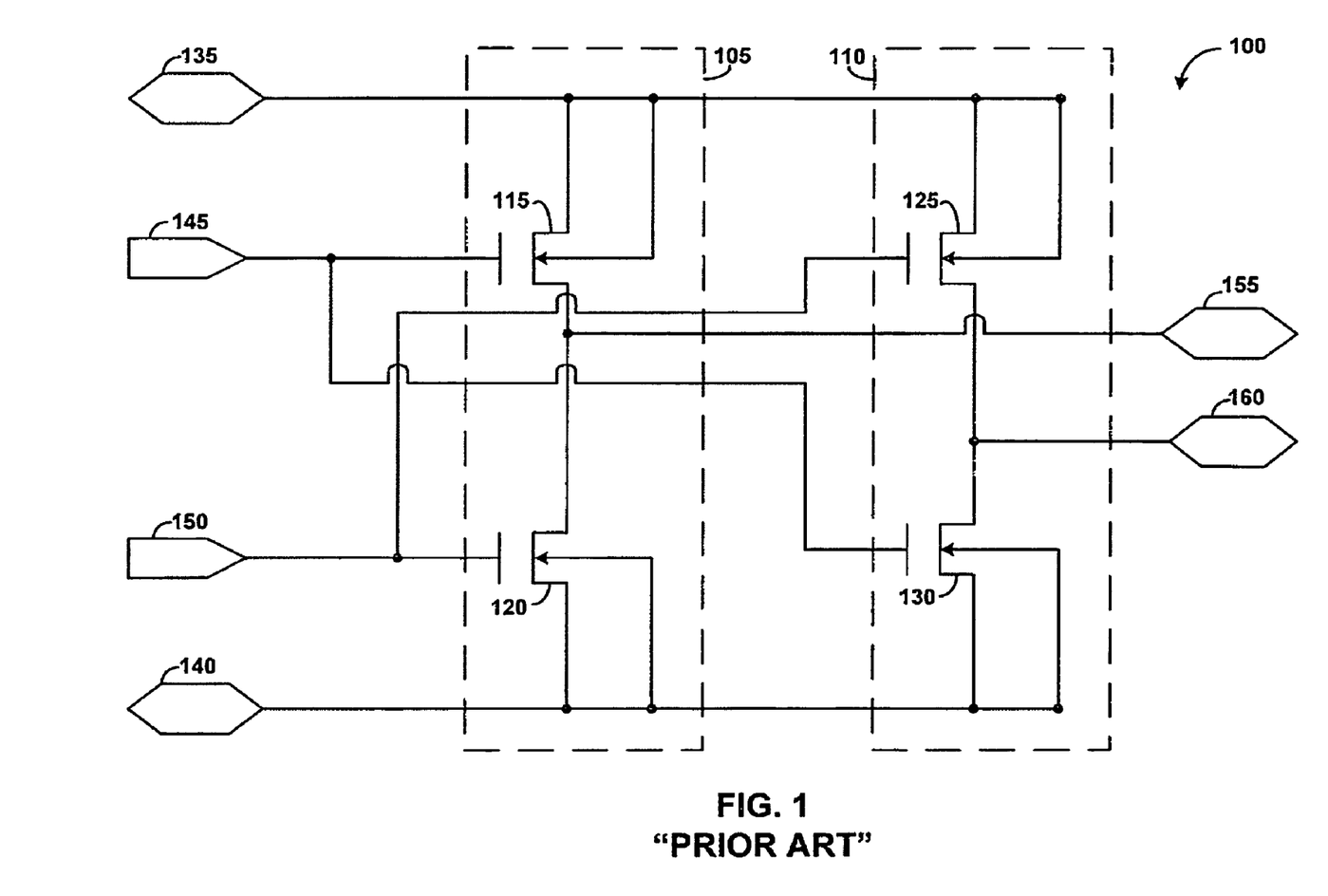
FIG. 1 is a schematic diagram illustrating an embodiment of a passive differential mixer circuit.

Referring now to FIG. 1, a schematic diagram of a current complementary-metal-oxide semiconductor (CMOS) passive mixer circuit 100 is shown. The mixer 100 comprises a first stage 105 and a second stage 110. Each stage comprises two n-type field effect transistors (FETs). In this regard, the first mixer stage 105 comprises FETs 115 and 120. The second stage 110 comprises FETs 125 and 130.

The mixer 100 also comprises radio frequency (RF) mixed signal terminals 135 and 140 and local oscillator (LO) signal terminals 145 and 150. The RF mixed signal terminals 135 and 140 are used to communicate RF mixed signals to and/or from the mixer 100, such as for use in a radio receiver, transmitter and/or transceiver. The LO signal terminals 145 and 150 are used to supply a LO signal to the mixer 100 for use in up-converting and/or down-converting signals processed by the mixer 100. The mixer 100 further comprises baseband signal terminals 155 and 160, which are used to communicate baseband signals (e.g. voice) to and/or from the mixer 100. As was noted above, while this disclosure is generally directed to RF applications, it will be appreciated that other applications for such mixer circuits exist.

The RF, LO and baseband signals that are typically employed with the mixer 100 are differential signals, with opposite phases of such signals being communicated on each of the respective differential signal terminal pairs. (RF 135/140; LO 145/150; and baseband 155/160). A mixed RF signal is generated by the mixer 100 by communicating a differential baseband signal to the mixer 100 via the baseband signal terminals 155 and 160 and communicating a differential LO signal to the mixer 100 via the LO signal terminal 145 and 150. The differential LO signal, for RF applications, is a signal having a frequency in the RF range. The differential baseband signal is typically a signal in the kilohertz range, such as a signal corresponding to a human voice.

The LO signal and the baseband signal are then mixed (e.g. up-converted) by generating a mixed RF differential signal that may be communicated external to the mixer 100 via the RF signal terminals 135 and 140. The mixed RF signal may then be communicated to, for example, an antenna for airborne transmission, such as from one handheld two-way radio to another. The mixed signal is generated as the result of the baseband signal being conducted by the FETs 115-103 of the first and second mixer stages 105 and 110 in dependence on the LO signals applied to the gates of those FETs.

The mixer 100 may also extract a baseband signal from a previously mixed RF signal, as has been previously indicated. In this situation, the mixer 100 receives the mixed RF signal via the RF signal terminals 135 and 140. An LO signal is communicated to the mixer 100 via the LO signal terminals 145 and 150. The first and second mixer stages (105 and 110) then process the received mixed RF signal with the LO signal to extract a baseband signal. The baseband signal is then communicated out of the mixer 100 via the baseband signal terminals 155 and 160. The baseband signal may then, in certain embodiments, be communicated to an audio processing circuit (not shown) for playback, such as in a handheld two-way radio or a radio receiver.

However, as was previously indicated, the mixer 100 has certain drawbacks. For example, the LO signals that are used to drive the gates of the transistors 115, 120, 125, 130 need to be on the order of the power supply voltage for the particular technology on which the mixer 100 is implemented. For instance, the desired amplitude of the LO signal might be on the order of 3V. As was discussed above, design of such high amplitude LO circuits that operate at 1 to 5 GHz is difficult and expensive. Furthermore, such high amplitude LO circuits consume a lot of power, which makes them undesirable in certain applications (e.g., battery operated applications). Furthermore, such high amplitude LO circuits may generate noise (e.g., due to high switching currents) that is communicated through the mixer 100 to other circuits that are coupled with the mixer 100, which is undesirable. Based on the foregoing, alternative approaches for implementing mixer circuits are desirable.

Mixer Circuit with Direct-Current Bias

An example embodiment of a mixer circuit with direct-current bias will be generally described with reference to FIG. 2. The example embodiment will then be described in further detail with reference to FIGS. 3 and 4.

Figure 2:
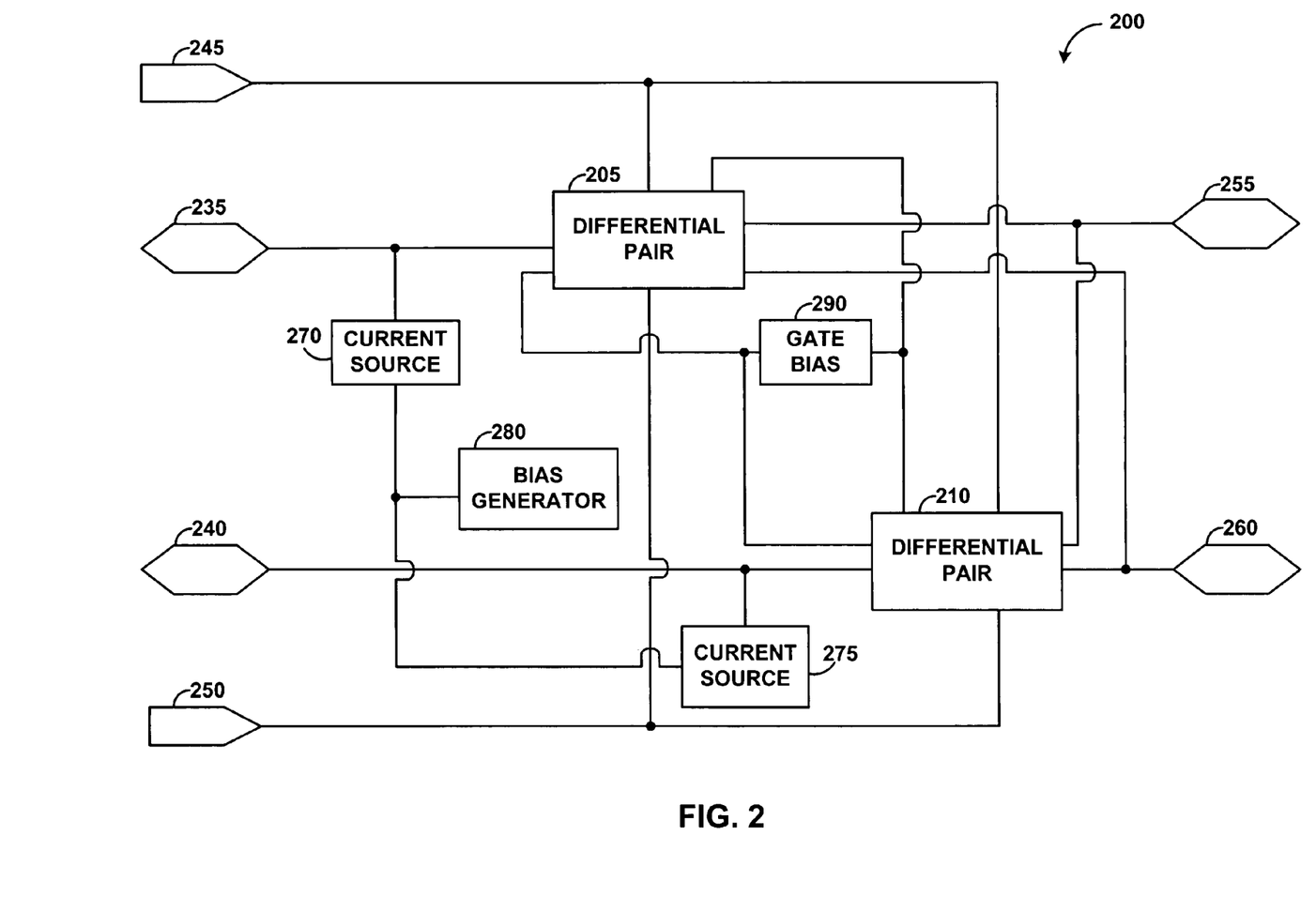
FIG. 2 is a schematic/block diagram illustrating a mixer circuit with direct-current bias.

In FIG. 2, a block diagram of an example mixer circuit 200 with direct-current (DC) bias is shown. In the mixer circuit 200, the signal terminals are referenced with 200 series reference numbers that correspond with the 100 series reference numbers used to reference signal terminals FIG. 1. Specifically, the first and second LO signal terminals for the mixer 200 are, respectively, LO signal terminal 245 and LO signal terminal 250. Similarly, the first and second mixed signal terminals (e.g., RF signal terminals) for the mixer 200 are, respectively, mixed signal terminal 235 and mixed signal terminal 240. In like fashion, the first and second baseband signal terminals (which could also be intermediate frequency signal terminals) for the mixer 200 are, respectively, baseband signal terminal 255 and baseband signal terminal 260.

The mixer circuit 200 further includes a first differential transistor pair 205 and a second differential transistor pair 210. Depending on the particular embodiment, the first differential transistor pair 205 may correspond with the transistors 115 and 125 of the mixer 100 shown in FIG. 1. Likewise depending on the particular embodiment, the second differential transistor pair 210 may correspond with the transistors 120 and 130 of the mixer 100 of FIG. 1.

The mixer circuit 200 further includes a first current source 270 and a second current source 275. The first current source 270 is coupled with the first differential transistor pair 205 and the first mixed signal terminal 235 to provide a direct-current bias to the first differential transistor pair 205 that allows for use of a reduced amplitude LO signal to be used on the first LO signal terminal 245 when operating the mixer 200. Likewise, the second current source 275 is coupled with the second differential transistor pair 210 and the second mixed signal terminal 240 to provide a direct-current bias to the second differential transistor pair 210 that allows for use of a reduced amplitude LO signal to be used on the second LO signal terminal 245 when operating the mixer 200.

The mixer circuit 200 also includes a bias-generator circuit 280 that is coupled with the first and second current sources 270,275. The bias-generator circuit may take any number of forms and provides one or more bias signals (e.g., direct-current voltage signals) that are used by the current sources 270,275 to generate the direct-current biases that are communicated, respectively to the first and second differential transistor pairs 205,210.

The mixer circuit 200 additionally includes a gate bias circuit 290. The gate bias circuit 290 generates and communicates a direct-current voltage bias to gate terminals of the transistors of the first and second differential pairs 205,210. Depending on the particular embodiment, the gate-bias circuit 290 also provides isolation between the LO signal terminals 245,250, such that the individual components (e.g., positive and negative) of a differential LO signal applied to the LO signal terminals 245,250 are electrically isolated from each other so that the signals are not "clamped" to the same voltage potential.

Figure 3:
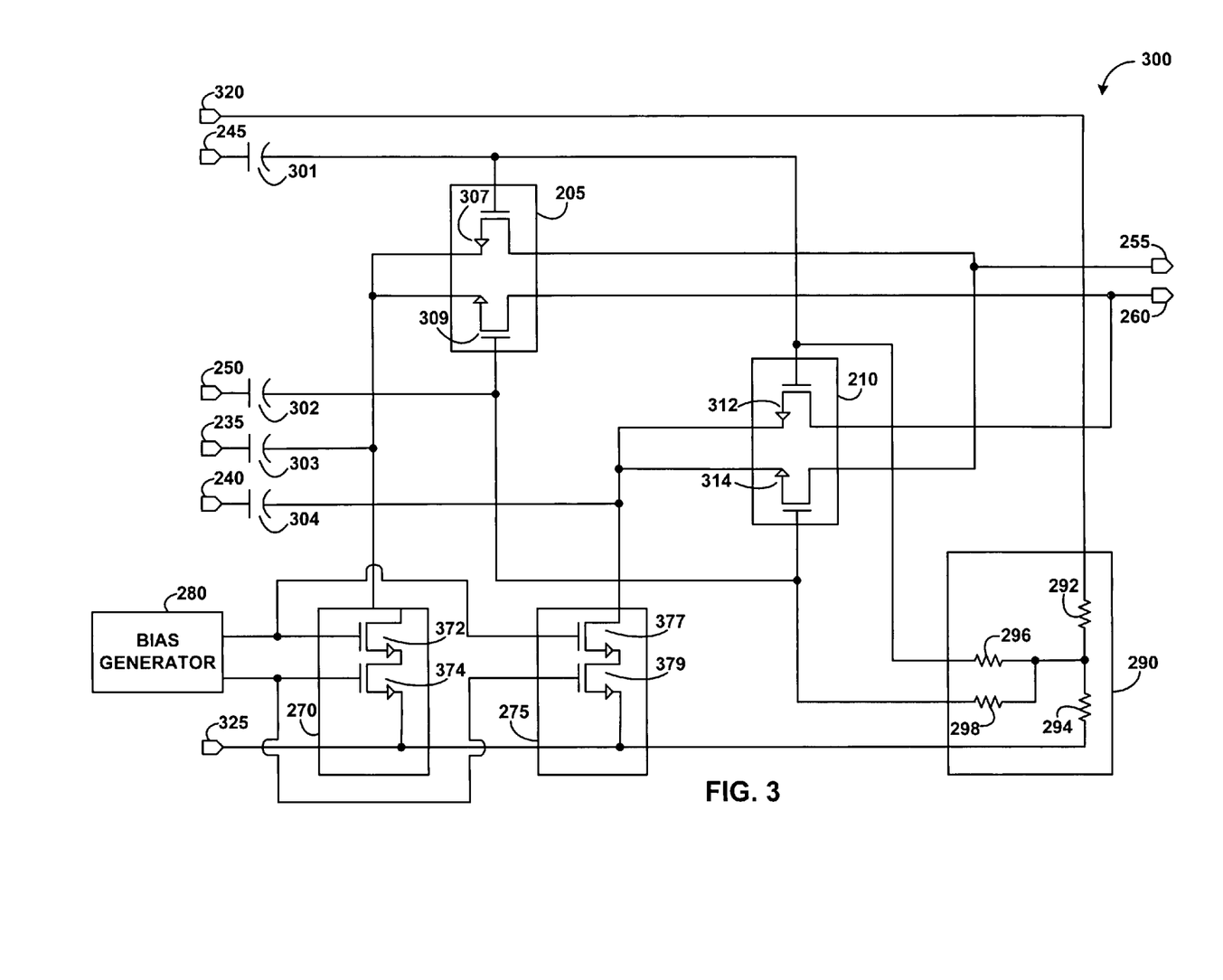
FIG. 3 is a schematic diagram illustrating portions of the mixer circuit of FIG. 2 in further detail.

Referring now to FIG. 3, a schematic diagram illustrating a mixer circuit 300 is shown. The schematic diagram of the mixer circuit 300 is a more detailed embodiment of the mixer circuit 200 shown in FIG. 2. Accordingly, like elements in FIG. 3 have been referenced with the same reference numbers that were used in FIG. 2.

The mixer circuit 300, in addition to the elements illustrated in FIG. 2, also includes capacitors 301,302,303,304. The capacitors 301,302,303,304 operate to filter noise for signals communicated to and/or from the mixer circuit on the LO signal terminals 245,250 and the mixed signal terminals 235,240.

As shown in FIG. 3, the first differential pair 205 of the mixer circuit 300 includes a first n-type FET transistor 307 and a second n-type FET transistor 309. The transistors 307 and 309 have a common source connection that is coupled with the first mixed signal terminal 235 and the first current source 270. In similar fashion, the second differential pair 210 of the mixer circuit 300 includes a first n-type FET transistor 312 and a second n-type FET transistor 314. The transistors 312 and 314 have a common source connection that is coupled with the second mixed signal terminal 240 and the second current source 275.

The first and second local oscillator signal terminals 245,250 are coupled with the first and second differential pairs 205,210. Specifically, the first local oscillator signal terminal 245 is coupled with a gate terminal of the first transistor 307 of the first differential pair 205 and a gate terminal of the first transistor 312 of the second differential pair 210. The second local oscillator signal terminal 250 is coupled with a gate terminal of the second transistor 309 of the first differential pair 205 and a gate terminal of the second transistor 314 of the second differential pair 210.

In this configuration, when a differential local oscillator signal is applied to the first and second local oscillator signal terminals 245,250, the first transistors 307,312 of the first and second differential pairs 205,210 operate substantially in phase with one another. Likewise, when a differential local oscillator signal is applied to the first and second local oscillator signal terminals 245,250, the second transistors 309,314 of the first and second differential pairs 205,210 operate substantially in phase with one another (and 180 degrees out of phase with the first transistors 307,312).

In the mixer 300, the first and second baseband signal terminals 255,260 are also coupled with the first and second differential pairs 205,210. Specifically, the first baseband signal terminal 255 is coupled with a drain terminal of the first transistor 307 of the first differential pair 205 and a drain terminal of the second transistor 314 of the second differential pair 210. The second baseband signal terminal 260 is coupled with a drain terminal of the second transistor 309 of the first differential pair 205 and a drain terminal of the first transistor 312 of the second differential pair 210. Differential signals are up-mixed and down-mixed using the mixer 300 in substantially similar fashion as was described above with respect to FIG. 2. However, the use of direct-current biases applied to the differential pairs 205,210 allows for the use of a reduced amplitude local oscillator signal and for the above-described advantages of reduced power, noise and cost to be achieved. For purposes of brevity and clarity, the process of up-mixing and down-mixing signals will not be described in detail again here.

The mixer circuit 300, in like fashion as the mixer circuit 200, includes the first current source 270 and the second current source 275. The first and second current sources 270, 275 operate as substantially matched current mirrors that provide respective direct-current biases to the first differential pair 205 and the second differential pairs 210.

These direct current biases (in combination with the gate biases provided by the gate bias circuit 290) result in the transistors of the first and second differential pairs 205,210 being "slightly on" during operation of the mixer circuit 300. This "slightly on" condition allows for the use of a reduced amplitude local oscillator signal to be used to mix and/or un-mix signals using the mixer circuit 300.

As shown in FIG. 3, the first current source 270 includes two n-type FETs 372,374 arranged in a stacked (current mirror) configuration. The FETs 372,374 are coupled with the bias generator 280, which provides two direct-current voltage biases to the current source 270. The current source 270 uses these voltage biases to "mirror" current references provided to the bias generator 280. The second current source 275 is a substantially matched current mirror with the first current source 270 and operates in substantially the same way as the first current source 270. Accordingly, for the mixer circuit 300, the first and second current sources 270,275 respectively provide substantially identical direct-current biases to the first and second differential pairs 205,210.

In the mixer circuit 200, the gate-bias circuit 290 is coupled with gate terminals of the first and second transistors 307,309 of the first differential pair 205 and the first and second transistors 312,314 of the second differential pair. The gate-bias circuit 290 provides a direct-current voltage bias to those gate terminals.

As shown in FIG. 3, the mixer circuit 300 further includes a power supply terminal 320 that, in operation, delivers a power supply voltage to the gate-bias circuit 290. The mixer circuit 300 also includes an electrical ground supply terminal 325 that, in operation, provides an electrical ground reference to the gate bias circuit 290.

The gate bias circuit 290 includes a resistor divider (including resistors 292,294) that is coupled between the power supply terminal 320 and the ground supply terminal 325. The resistor divider, in operation, establishes a direct-current voltage potential based on the applied power supply voltage. The established voltage is then applied to gate terminals of the transistors of the first and second differential pairs 205,210 through two series resistors 296,298. The series resistors 296,298 provide electrical isolation between the two components (positive and negative) of the differential local oscillator signal that is communicated to the transistors of the gate terminal first and second differential pairs 205,210. The series resistors 296,298 prevent the two components of the differential local oscillator signal from being clamped to one another.

By providing direct-current biases to the first and second differential pairs 205,210 of the mixer 300 using the first and second current sources 270,275, a reduced amplitude local oscillator signal (reduced by a factor of two or three) may be used with the mixer 300. Thus, when implementing the mixer 300 using a semiconductor technology that has an operating voltage on the order of 3.0 volts, the amplitude of the local oscillator signal used by the mixer 300 may be reduced from around 3.0 volts to a signal in the range of 1.0 to 1.5 volts. This reduction will result in significant power savings (e.g., due to reduction of switching currents) and reduced noise generation. It will be appreciated that the reduction in power will be exponential due the exponential dependence of power on current.

Additionally, as was discussed above, the design process for a reduced amplitude local oscillator circuit will be significantly less complex than a high amplitude circuit with comparable timing characteristics. Therefore, the cost of designing such circuits will also be reduced. Still further, the circuit area (e.g., in an integrated circuit) consumed by a reduced amplitude local oscillator circuit may be significantly less than the area consumed by a comparable high amplitude circuit. Thus, the cost of manufacturing a reduced amplitude local oscillator circuit may also be reduced as compared to a high amplitude circuit.

Bias Generator

Figure 4:
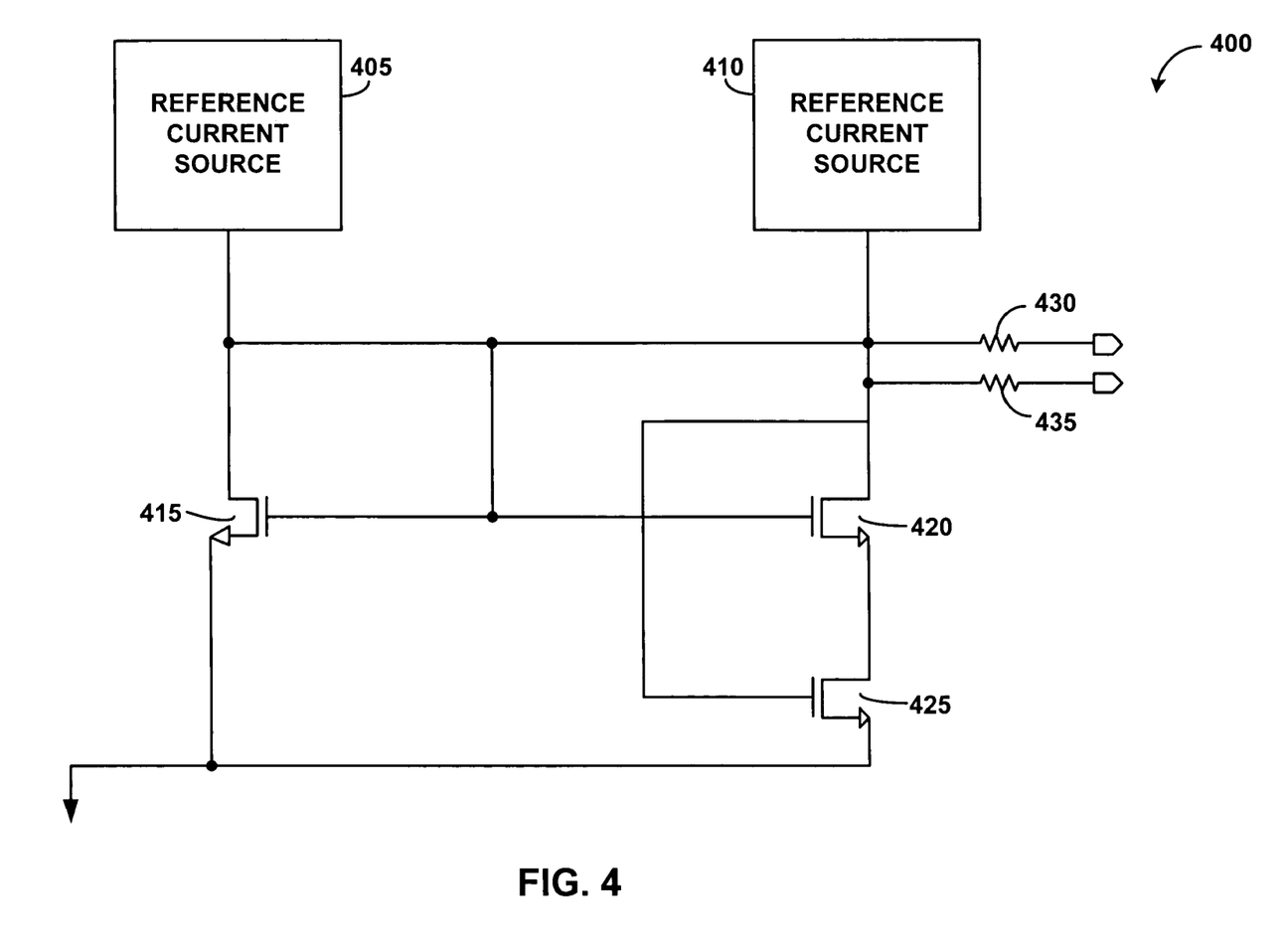
FIG. 4 is a schematic diagram of a cascoded bias generator that may be implemented in the mixer of FIG. 3.

FIG. 4 illustrates a cascoded bias generator 400 that may be implemented in the mixer circuit of FIGS. 2 and 3 as the bias generator 280 to provide voltage biases to drive the current sources 270,275, which in turn mirror current reference signals provided to the bias generator 400 by reference current sources 405,410. The voltage biases of the bias generator 400 are communicated to the current sources 270,275 via respective series resistors 430,435.

Such cascoded bias generator circuits are known. Therefore, for the purposes of brevity, the operation of such circuits will not be described in detail here. Briefly, however, the bias generator 400 includes n-type FETs 415, 420 and 425. The bias generator produces voltage biases from the reference currents provided by the current sources 405,410 using the n-type FETs 415, 420 and 425. These biases are communicated to the current sources 270,275 of the circuit 200, which mirrors the currents provided by the reference current sources.

Circuit Performance of Passive Mixer with Direct-Current Bias

Figure 5:
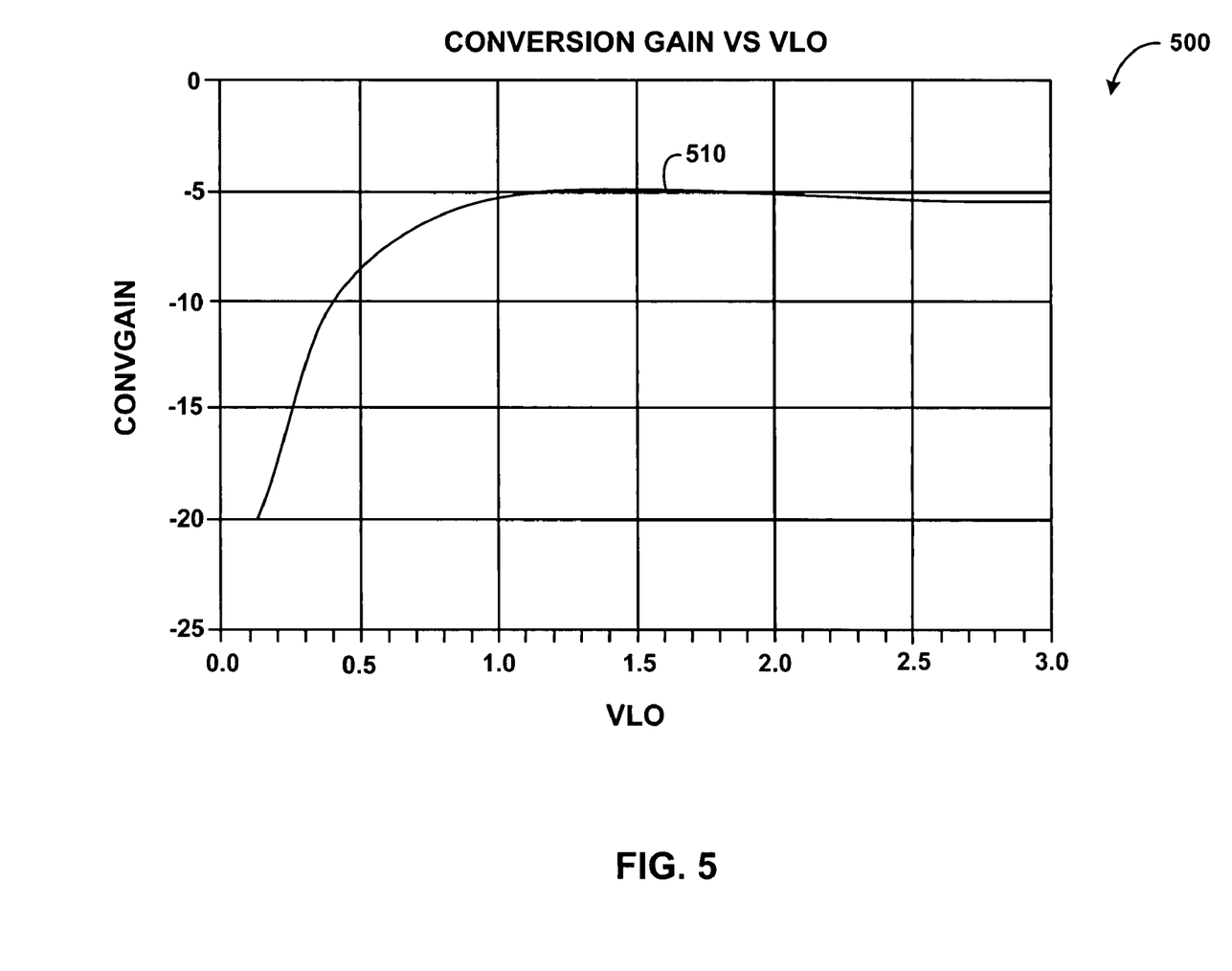
FIG. 5 is a graph illustrating the conversion gain of the mixer circuit of FIG. 3 versus local oscillator voltage amplitude.
Figure 6:
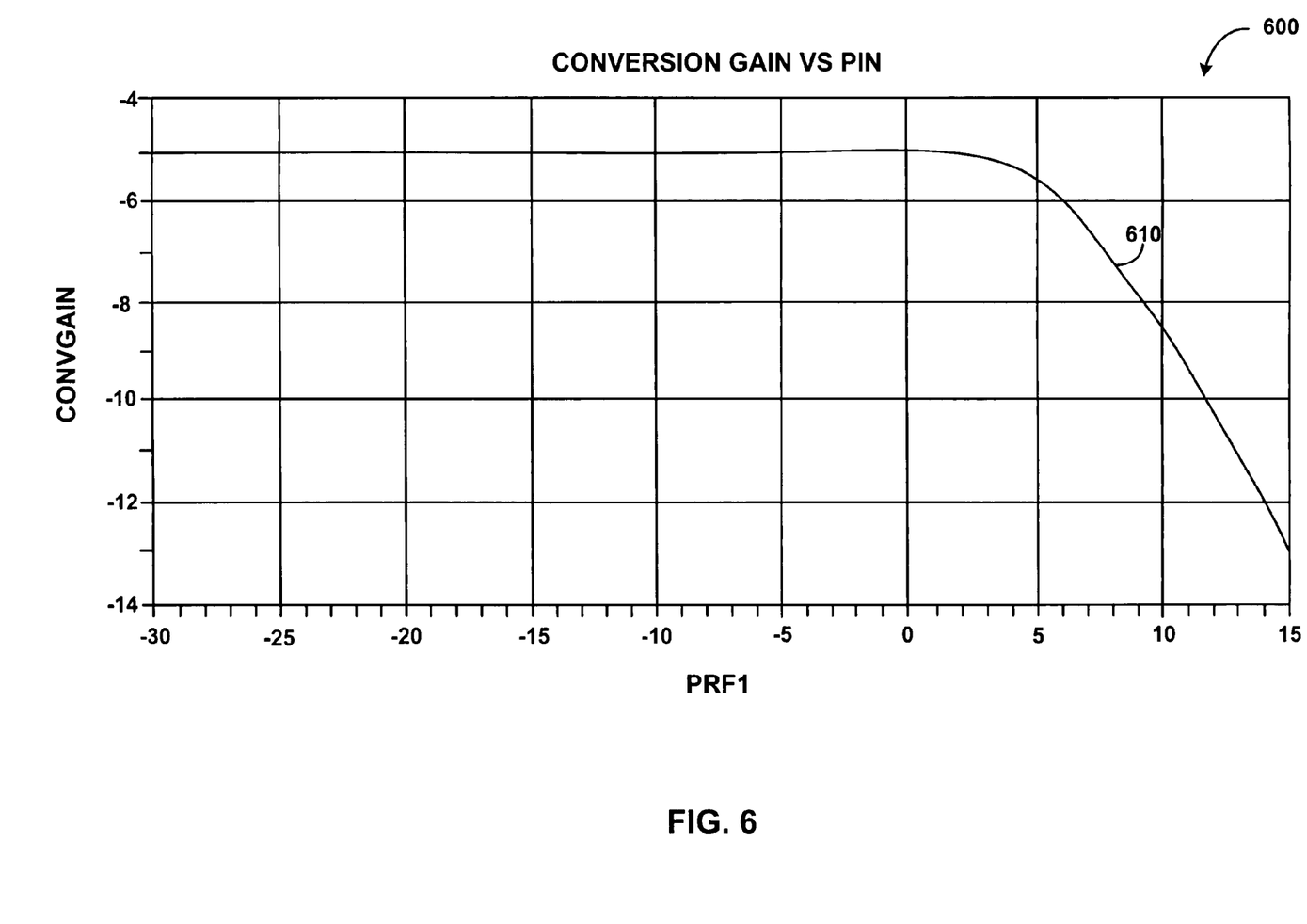
FIG. 6 is a graph illustrating the conversion gain of the mixer circuit of FIGS. 3 versus received RF power.
Figure 7:
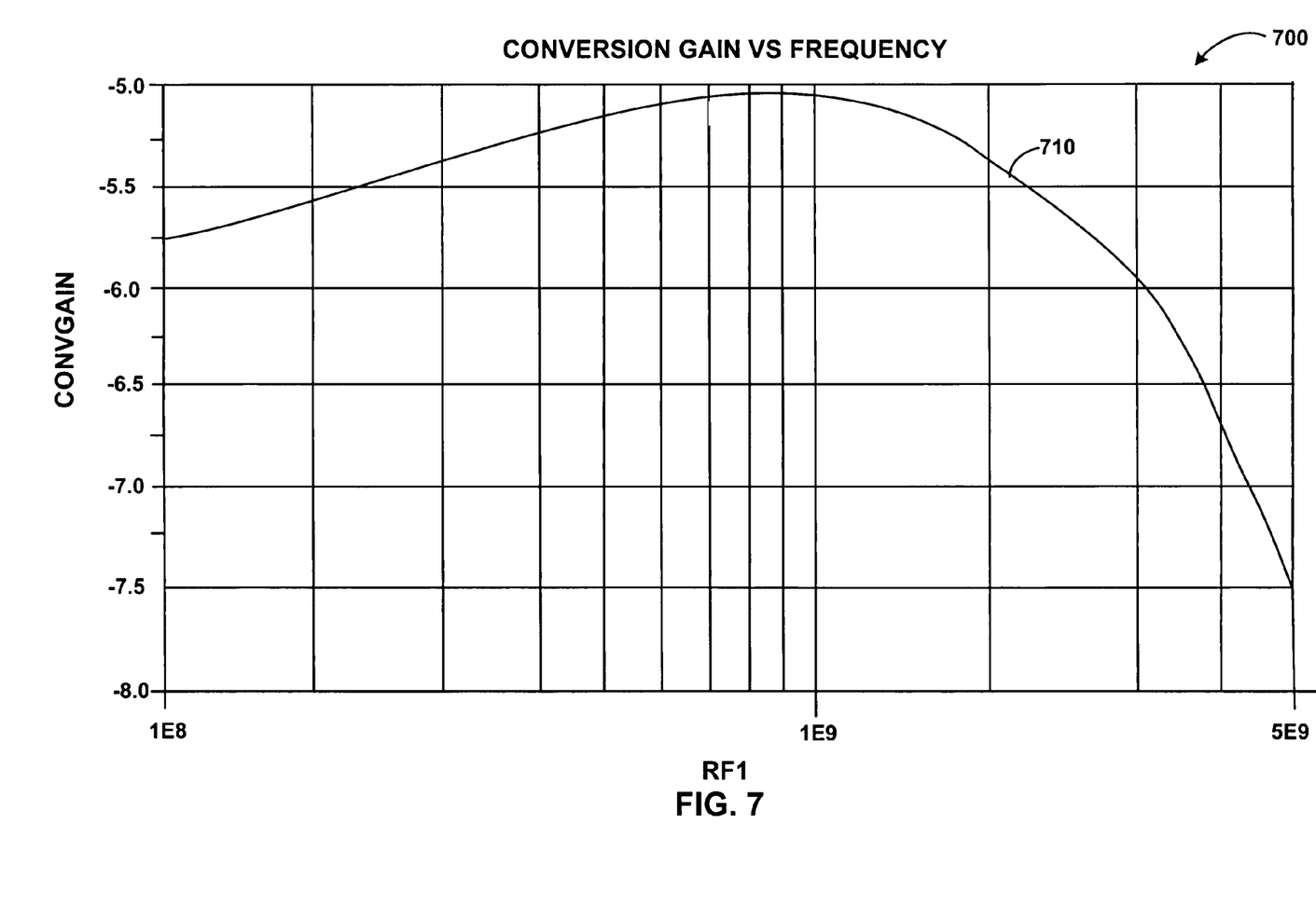
FIG. 7 is a graph illustrating the conversion gain of the mixer circuit of FIG. 3 versus local oscillator frequency.

FIGS. 5, 6 and 7 illustrate circuit performance characteristics for the mixer circuit 300 shown in FIG. 3 when implemented with the bias generator circuit 400 shown in FIG. 4. It is noted that the conversion gain and other circuit performance measurements that are illustrated in FIGS. 5-7 are comparable with the performance of an analogous passive mixer that does not implement direct-current bias, as has been described herein.

FIG. 5 is a graph 500 that illustrates the conversion gain of the mixer circuit 300 as a function of the voltage amplitude of an applied local oscillator signal. It is noted that, for an analogous passive mixer without direct-current bias, the conversion gain would reach its upper limit for a local oscillator signal amplitude in the range of the operating voltage for the particular technology employed (e.g., in this case, 3.0 volts). In FIG. 5, a curve 510 illustrates the conversion gain of the mixer circuit 300 as a function of the local oscillator signal voltage. As shown by the curve 510, a conversion gain of −5 dBm (the upper gain limit) is achieved when the local oscillator signal amplitude is approximately 1.0V (as compared to approximately 3.0 volts for previous approaches). Therefore, FIG. 5 demonstrates that local oscillator signal amplitude for the mixer circuit 300 may be reduced by a factor of three without resulting in any significant adverse effects on performance as compared to an analogous high amplitude local oscillator mixer circuit.

FIG. 6 is a graph 600 that illustrates the conversion gain of the mixer circuit 300 as a function of the received mixed signal power (e.g., RF power). For the graph 600, the local oscillator signal amplitude was held constant at 1.0 volt. The curve 610 shows this relationship between conversion gain and the mixed signal power. As shown in FIG. 6, the conversion gain is approximately −5 dBm for mixed signal powers up to approximately −5 dBm with a 1 dBm compression point at a mixed signal power of just over 5 dBm. It will be appreciated that the 1 dBm compression point is a measure of the upper operating range for such mixer circuits. Again, conversion gain for the mixer circuit 300 as a function of mixed signal power is comparable with an analogous passive mixer circuit that does not implement direct-current bias as described herein.

FIG. 7 is a graph 700 that illustrates the conversion gain of the mixer circuit 300 as a function of the received mixed signal frequency (e.g., RF frequency). For the graph 700, the local oscillator signal amplitude was held constant at 1.0 volt. A curve 710 shows this relationship between conversion gain and mixed signal frequency. As shown in FIG. 7, the conversion gain is approximately −5 dBm for mixed signal frequencies in the range of 1 GHz. In like fashion as with FIGS. 5 and 6, the conversion gain for the mixer circuit 300 as a function of mixed signal frequency is comparable with an analogous passive mixer circuit that does not implement direct-current bias as has been described herein.

CONCLUSION

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

What is claimed is:

1. A mixer circuit comprising:
   a first differential transistor pair;
   a second differential transistor pair;
   first and second local oscillator signal terminals coupled with the first and second differential transistor pairs;
   first and second mixed signal terminals, the first mixed signal terminal being coupled with the first differential pair and the second mixed signal terminal being coupled with the second differential pair;
   first and second baseband signal terminals, each baseband signal terminal being coupled with the first differential pair and the second differential pair;
   a first current source coupled with the first differential pair and the first mixed signal terminal, the first current source, in operation, providing a first direct-current bias to the first differential pair;
   a second current source coupled with the second differential pair and the second mixed signal terminal, the second current source, in operation, providing a second direct-current bias to the second differential pair; and
   a gate-bias circuit coupled with the first and second differential transistor pairs, the gate-bias circuit, in operation, providing a direct-current voltage bias to gate terminals of the first and second differential transistor pairs,
   wherein the gate-bias circuit comprises:
      a power supply terminal that, in operation, delivers a power supply voltage to the gate-bias circuit;
      an electrical ground supply terminal that, in operation, provides an electrical ground reference to the gate-bias circuit;
      a resistor divider coupled between the power supply terminal and the ground supply terminal, the resistor divider, in operation, establishing a direct-current voltage potential based on the power supply voltage, wherein the established voltage is applied to gate terminals of transistors of the first and second differential pairs;
      a first series resistor coupled with the resistor divider and respective gate terminals of a first transistor of the first differential pair and a first transistor of the second differential pair, so as to deliver the established voltage potential; and
      a second series resistor coupled with the resistor divider and respective gate terminals of a second transistor of the first differential pair and a second transistor of the second differential pair, so as to deliver the established voltage potential.

2. The mixer circuit of claim 1, further comprising a bias-generation circuit coupled with the first and second current sources, wherein, in operation, the bias generation circuit provides one or more direct-current voltage biases to the first and second current sources and the first and second current sources generate the first and second direct-current biases based on the one or more direct-current voltage biases.

3. The mixer circuit of claim 2, wherein the bias-generation circuit comprises a cascoded voltage bias generator circuit, the cascoded voltage bias generator circuit, in operation, producing two direct-current voltage biases.

4. The mixer circuit of claim 3, wherein the first and second current sources comprise substantially matched current mirrors, each current source including two transistors connected in a stacked configuration, the two direct-current biases being applied, in operation, to respective, corresponding gates of the transistors of the first and second current sources.

5. The mixer circuit of claim 1, wherein the first and second differential pairs each comprise first and second n-type field effect transistors, the first and second n-type field effect transistors of each differential pair having a common source connection.

6. The mixer circuit of claim 5, wherein:
   the common source connection of the first differential pair is coupled with the first mixed signal terminal and the first current source; and
   the common source connection of the second differential pair is coupled with the second mixed signal terminal and the second current source.

7. A mixer circuit comprising:
   a first differential transistor pair including a first transistor and a second transistor;
   a second differential transistor pair including a third transistor and a fourth transistor;
   first and second local oscillator signal terminals coupled with the first and second differential transistor pairs such that, in operation, when a differential local oscillator signal is applied to the first and second local oscillator signal terminals, the first and third transistors operate substantially in phase with one another and the second and fourth transistors operate substantially in phase with one another;
   first and second mixed signal terminals, the first mixed signal terminal being coupled with the first differential pair and the second mixed signal terminal being coupled with the second differential pair;
   first and second baseband signal terminals, the first baseband signal terminal being coupled with the first and fourth transistors and the second baseband signal terminal being coupled with the second and third transistors;
   a gate-bias circuit coupled with gate terminals of the first, second, third and fourth transistors, the gate-bias circuit, in operation, providing a direct-current voltage bias to the gate terminals of the first, second, third and fourth transistors;
   a first current source coupled with the first differential pair and the first mixed signal terminal, the first current source, in operation, providing a direct-current bias to the first differential pair; and
   a second current source coupled with the second differential pair and the second mixed signal terminal, the second current source, in operation, providing a direct-current bias to the second differential pair,
   wherein the first current source and the second current source comprise substantially matched respective first and second current mirrors, wherein each of the substantially matched current mirrors includes two transistors connected in a stacked arrangement, wherein the first current mirror supplies a first direct-current bias to source terminals of the first and second transistors of the first differential pair and the second current mirror supplies a second direct-current bias to source terminals of the third and fourth transistors of the second differential pair, the second direct-current bias being substantially equal to the first direct-current bias.

8. The mixer circuit of claim 7, farther comprising a bias-generation circuit coupled with the first and second current sources, wherein, in operation, the bias generation circuit provides one or more direct-current voltage biases to corresponding gate terminals of the transistors of both the first and second current sources.

9. The mixer circuit of claim 8, wherein the bias-generation circuit comprises a cascoded voltage bias-generation circuit.

10. The mixer circuit of claim 7, wherein the first and second transistors of the first differential pair and the third and fourth transistors of the second differential pair comprise n-type FET transistors, the first and second transistors having a common source connection and the third and fourth transistors having a common source connection.

11. The mixer circuit of claim 10, wherein:
the first baseband signal terminal is coupled with respective drain terminals of the first transistor and the fourth transistor,
the second baseband signal terminal is coupled with respective drain terminals of the second transistor and the third transistor;
the first mixed signal terminal and the first current source are coupled with respective source terminals of the first and second transistors; and
the second mixed signal terminal and the second current source are coupled with respective source terminals of the third and fourth transistors.

12. The mixer circuit of claim 7, wherein the gate-bias circuit comprises:
a power supply terminal that, in operation, delivers a power supply voltage to the gate-bias circuit;
an electrical ground supply terminal that, in operation, provides an electrical ground reference to the gate bias circuit;
a resistor divider coupled between the power supply terminal and the ground supply terminal, the resistor divider, in operation, establishing a direct-current voltage potential based on the power supply voltage, wherein the established voltage is applied to gate terminals of the first, second, third and fourth transistors;
a first series resistor coupled with the resistor divider and respective gate terminals of the first and third transistors, so as to deliver the established voltage potential; and
a second series resistor coupled with the resistor divider and respective gate terminals of the second and fourth transistors, so as to deliver the established voltage potential.

13. A mixer circuit comprising:
a first differential transistor pair including a first transistor and a second transistor;
a second differential transistor pair including a third transistor and a fourth transistor;
first and second local oscillator signal terminals coupled with the first and second differential transistor pairs such that, in operation, when a differential local oscillator signal is applied to the first and second local oscillator signal terminals, the first and third transistors operate substantially in phase with one another and the second and fourth transistors operate substantially in phase with one another;
first and second mixed signal terminals, the first mixed signal terminal being coupled with the first differential pair and the second mixed signal terminal being coupled with the second differential pair;
first and second baseband signal terminals, the first baseband signal terminal being coupled with the first and fourth transistors and the second baseband signal terminal being coupled with the second and third transistors;
a gate-bias circuit coupled with gate terminals of the first, second, third and fourth transistors, the gate-bias circuit, in operation, providing a direct-current voltage bias to the gate terminals of the first, second, third and fourth transistors,
wherein the gate-bias circuit comprises
a resistor divider, which, in operation, establishes a direct-current voltage potential based on a power supply voltage, wherein the established voltage is applied to gate terminals of the first, second, third and fourth transistors,
a first series resistor coupled with the resistor divider and respective gate terminals of the first and third transistors, so as to deliver the established voltage potential, and
a second series resistor coupled with the resistor divider and respective gate terminals of the second and fourth transistors, so as to deliver the established voltage potential;
a first current source including two stacked transistors, the first current source being coupled with the first differential pair and the first mixed signal terminal, the first current source, in operation, providing a direct-current bias to the first differential pair;
a second current source including two stacked transistors, the second current source being coupled with the second differential pair and the second mixed signal terminal, the second current source, in operation, providing a direct-current bias to the second differential pair; and
a bias-generation circuit coupled with the first and second current sources, wherein, in operation, the bias generation circuit provides one or more direct-current voltage biases to corresponding gate terminals of the stacked transistors of the first and second current sources.

14. The mixer circuit of claim 13, wherein the bias-generation circuit comprises a cascoded voltage bias-generation circuit.

15. The mixer circuit of claim 13, wherein the first current source and the second current source comprise substantially matched respective first and second current mirrors that, in operation, provide respective substantially equivalent direct current biases to the first and second differential transistor pairs.

* * * * *